United States Patent
Sato

(10) Patent No.: US 11,676,984 B2
(45) Date of Patent: Jun. 13, 2023

(54) SOLID-STATE IMAGING DEVICE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventor: Naoyuki Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/175,135

(22) Filed: Feb. 12, 2021

(65) Prior Publication Data

US 2021/0167111 A1 Jun. 3, 2021

Related U.S. Application Data

(63) Continuation of application No. 16/410,509, filed on May 13, 2019, now Pat. No. 10,950,646, which is a
(Continued)

(30) Foreign Application Priority Data

May 16, 2014 (JP) ................. 2014-102315

(51) Int. Cl.
*H01L 27/146* (2006.01)
*H01L 31/0236* (2006.01)

(52) U.S. Cl.
CPC .... *H01L 27/14632* (2013.01); *H01L 27/1461* (2013.01); *H01L 27/1462* (2013.01);
(Continued)

(58) Field of Classification Search
None
See application file for complete search history.

(56) References Cited

U.S. PATENT DOCUMENTS 9,158,040 B2    10/2015 Kamiyama et al.
9,268,067 B2    2/2016  Tamura et al.
(Continued)

FOREIGN PATENT DOCUMENTS

CN    104282706    1/2015
JP    S57-192085   11/1982
(Continued)

OTHER PUBLICATIONS

International Search Report and Written Opinion for International (PCT) Patent Application No. PCT/JP2015/063058, dated Jul. 7, 2015, 21 pages.
(Continued)

*Primary Examiner* — Long Pham
(74) *Attorney, Agent, or Firm* — Sheridan Ross P.C.

(57) ABSTRACT

The present disclosure relates to a solid-state imaging device capable of further decreasing reflectivity, a method of manufacturing the same, and an electronic device. The solid-state imaging device includes a semiconductor substrate on which a photoelectric converting unit is formed for each of a plurality of pixels, and an antireflection structure provided on a light incident surface side from which light is incident on the semiconductor substrate in which a plurality of types of projections of different heights is formed. The antireflection structure is formed by performing processing of digging a light incident surface of the semiconductor substrate in a plurality of stages with different processing conditions. The antireflection structure is the structure in which a second projection lower than a first projection is formed between the first projections of predetermined height. The present technology may be applied to a CMOS image sensor, for example.

15 Claims, 9 Drawing Sheets

Related U.S. Application Data continuation of application No. 15/309,521, filed as application No. PCT/JP2015/063058 on May 1, 2015, now Pat. No. 10,325,950.

(52) U.S. Cl.
CPC .... *H01L 27/1464* (2013.01); *H01L 27/14623* (2013.01); *H01L 27/14685* (2013.01); *H01L 27/14687* (2013.01); *H01L 31/02363* (2013.01); *H01L 27/14621* (2013.01); *H01L 27/14627* (2013.01); *Y02E 10/50* (2013.01)

(56) References Cited

U.S. PATENT DOCUMENTS

| | | | |
|---|---|---|---|
| 10,325,950 | B2 | 6/2019 | Sato |
| 10,950,646 | B2 | 3/2021 | Sato |
| 2014/0320970 | A1 | 10/2014 | Kamiyam et al. |
| 2015/0168610 | A1 | 6/2015 | Fukui et al. |
| 2015/0241603 | A1* | 8/2015 | Fujii ................ G02B 1/11 359/601 |
| 2015/0362634 | A1 | 12/2015 | Iwase et al. |
| 2016/0220803 | A1 | 8/2016 | Kendall et al. |
| 2016/0370505 | A1 | 12/2016 | Koo et al. |
| 2019/0241603 | A1 | 8/2019 | Yang et al. |

FOREIGN PATENT DOCUMENTS

| | | |
|---|---|---|
| JP | H05-075152 | 3/1993 |
| JP | 2002-353484 | 12/2002 |
| JP | 2011-003860 | 1/2011 |
| JP | 2011-222900 | 11/2011 |

OTHER PUBLICATIONS

Official Action (with English translation) for Chinese Patent Application No. 201580023505.2, dated Aug. 9, 2019, 15 pages.
Official Action for U.S. Appl. No. 15/309,521, dated Jun. 13, 2017, 8 pages.
Official Action for U.S. Appl. No. 15/309,521, dated Dec. 6, 2017, 10 pages.
Official Action for U.S. Appl. No. 15/309,521, dated Jun. 15, 2018, 10 pages.
Notice of Allowance for U.S. Appl. No. 15/309,521, dated Feb. 1, 2019, 5 pages.
Corrected Notice of Allowance for U.S. Appl. No. 15/309,521, dated Mar. 6, 2019, 4 pages.
Official Action for U.S. Appl. No. 16/410,509, dated Jun. 5, 2020, 9 pages.
Notice of Allowance for U.S. Appl. No. 16/410,509, dated Nov. 13, 2020, 6 pages.

\* cited by examiner

SOLID-STATE IMAGING DEVICE, METHOD OF MANUFACTURING THE SAME, AND ELECTRONIC DEVICE

CROSS REFERENCE TO RELATED APPLICATIONS

This application is a continuation of U.S. patent application Ser. No. 16/410,509, filed May 13, 2019, which is a continuation of U.S. patent application Ser. No. 15/309,521, filed Nov. 8, 2016, now U.S. Pat. No. 10,325,950, which is a national stage application under 35 U.S.C. 371 and claims the benefit of PCT Application No. PCT/JP2015/063058 having an international filing date of May 1, 2015, which designated the United States, which PCT application claimed the benefit of Japanese Patent Application No. 2014-102315 filed May 16, 2014, the disclosures of which are incorporated herein by reference in their entirety.

TECHNICAL FIELD

The present disclosure relates to a solid-state imaging device, a method of manufacturing the same, and an electronic device, and especially relates to the solid-state imaging device capable of further decreasing reflectivity, the method of manufacturing the same, and the electronic device.

BACKGROUND ART

Conventionally, a solid-state image sensor such as a charge coupled device (CCD)/complementary metal oxide semiconductor (CMOS) image sensor is used, for example, in an electronic device having an imaging function such as a digital still camera and a digital video camera.

For example, incident light incident on the CMOS image sensor is subjected to photoelectric conversion by a photodiode (PD) being a photoelectric converting unit included in a pixel. Then, an electric charge generated by the PD is transferred to floating diffusion (FD) through a transfer transistor and an amplification transistor outputs a pixel signal of a level according to the electric charge accumulated in the FD.

In a conventional solid-state image sensor, there is a case in which the light incident on the solid-state image sensor is reflected therein and flare and ghost occur by the reflected light imaged in an image. For example, the light reflected by an on-chip lens and a silicon surface of the pixel of each color is reflected by a seal glass surface and an infrared radiation cutoff filter surface to be incident again on the photoelectric converting unit and the flare occurs. Also, for example, red light reflected by the silicon surface of the red pixel and the on-chip lens surface is reflected by a multi-coated surface of the infrared radiation cutoff filter to be incident again on the photoelectric converting unit and the ghost which looks like a red ball occurs.

In order to prevent such reflection of the light on the silicon surface to decrease the occurrence of the flare and ghost, a structure in which a fine uneven structure is periodically arranged, a so-called moth-eye structure is known. In the moth-eye structure, a refractive index gradually changes, so that reflectivity may be decreased.

For example, Patent Document 1 suggests the so-called moth-eye structure in which the fine uneven structure is formed on an interface on a side of a light receiving surface of a silicon layer in which the photodiode is formed as the structure of preventing the reflection of the incident light.

CITATION LIST

Patent Document

Patent Document 1: Japanese Patent Application Laid-Open No. 2013-33864

SUMMARY OF THE INVENTION

Problems to be Solved by the Invention

When the above-described moth-eye structure is processed by dry etching, a deeper concave portion may be formed by setting long processing time. However, when the moth-eye structure in which the concave portion is deep is formed by such processing, it is worried that processing damage increases, for example, a dark characteristic is deteriorated. Furthermore, it is worried that a trouble such as a residue occurs in a post process due to increased unevenness by the moth-eye structure. Therefore, it is required to avoid such worry to further decrease the reflectivity.

The present disclosure is achieved in view of such a condition and an object thereof is to further decrease the reflectivity.

Solutions to Problems

A solid-state imaging device according to one aspect of the present disclosure is provided with a semiconductor substrate on which a photoelectric converting unit is formed for each of a plurality of pixels, and an antireflection structure being the structure provided on a light incident surface side from which light is incident on the semiconductor substrate in which a plurality of types of projections of different heights is formed.

A method of manufacturing a solid-state imaging device according to one aspect of the present disclosure includes a step of forming an antireflection structure being the structure provided on a light incident surface side from which light is incident on a semiconductor substrate on which a photoelectric converting unit is formed for each of a plurality of pixels in which a plurality of types of projections of different heights is formed by performing processing of digging a light incident surface of the semiconductor substrate in a plurality of stages with different processing conditions.

An electronic device according to one aspect of the present disclosure is provided with a solid-state imaging device provided with a semiconductor substrate on which a photoelectric converting unit is formed for each of a plurality of pixels, and an antireflection structure being the structure provided on a light incident surface side from which light is incident on the semiconductor substrate in which a plurality of types of projections of different heights is formed.

In one aspect of the present disclosure, an antireflection structure being the structure in which a plurality of types of projections of different heights is formed is provided on a light incident surface side from which light is incident on a semiconductor substrate on which a photoelectric converting unit is formed for each of a plurality of pixels. In addition, the antireflection structure is formed by performing processing of digging a light incident surface of the semiconductor substrate in a plurality of stages with different processing conditions.

Effects of the Invention

According to one aspect of the present disclosure, the reflectivity may be further decreased.

MODE FOR CARRYING OUT THE INVENTION

A mode for carrying out the present disclosure (hereinafter, referred to as an embodiment) is hereinafter described. Meanwhile, the description is given in the following order.

1. Schematic Configuration Example of Solid-State Imaging Device
2. Pixel Structure according to This Embodiment
3. Example of Application to Electronic Device Hereinafter, a specific embodiment to which the present technology is applied is described in detail with reference to the drawings.

1. Schematic Configuration Example of Solid-State Imaging Device

Figure 1:
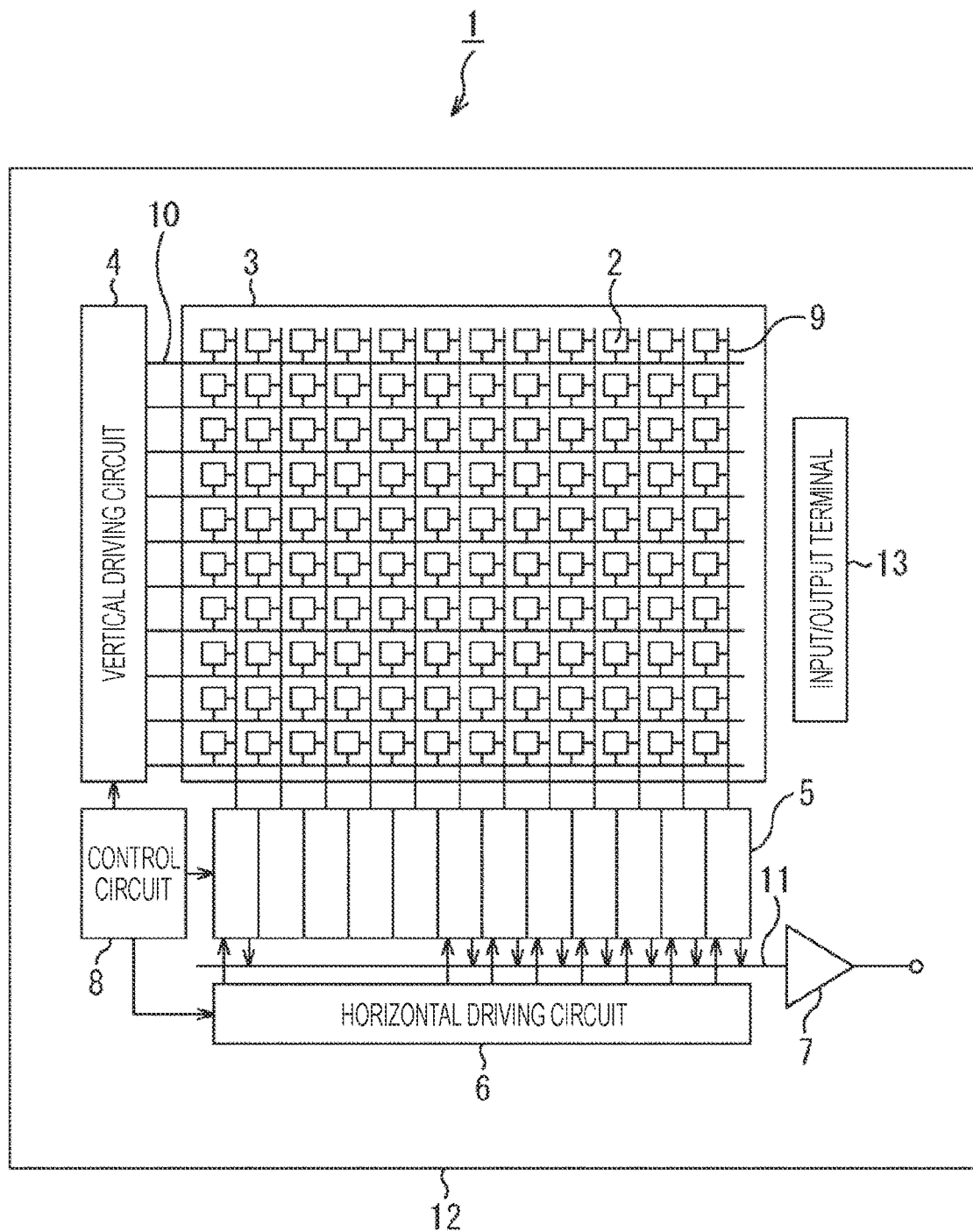
FIG. 1 is a view illustrating a schematic configuration of a solid-state imaging device according to the present disclosure.

FIG. 1 illustrates a schematic configuration of a solid-state imaging device according to the present disclosure.

A solid-state imaging device 1 in FIG. 1 is configured such that a semiconductor substrate 12 formed of silicon (Si), for example, as a semiconductor includes a pixel array unit 3 in which pixels 2 are arranged in a two-dimensional array pattern and a peripheral circuit unit around the same. The peripheral circuit unit includes a vertical driving circuit 4, a column signal processing circuit 5, a horizontal driving circuit 6, an output circuit 7, a control circuit 8 and the like.

The pixel 2 includes a photodiode as a photoelectric conversion element and a plurality of pixel transistors. A plurality of pixel transistors is formed of four MOS transistors which are a transfer transistor, a selection transistor, a reset transistor, and an amplification transistor, for example.

The pixel 2 may also have a shared pixel structure. The pixel shared structure is formed of a plurality of photodiodes, a plurality of transfer transistors, one shared floating diffusion (floating diffusion region), and other shared pixel transistors one for each type. That is to say, the shared pixel is configured such that the photodiodes and the transfer transistors formed of a plurality of unit pixels share other pixel transistors one for each type.

The control circuit 8 receives an input clock and data giving a command of an operation mode and the like and outputs data of internal information and the like of the solid-state imaging device 1. That is to say, the control circuit 8 generates a clock signal and a control signal serving as a reference of operation of the vertical driving circuit 4, the column signal processing circuit 5, and the horizontal driving circuit 6 on the basis of a vertical synchronization signal, a horizontal synchronization signal, and a master clock. Then, the control circuit 8 outputs the generated clock signal and control signal to the vertical driving circuit 4, the column signal processing circuit 5, the horizontal driving circuit 6 and the like.

The vertical driving circuit 4 formed of a shift register, for example, selects pixel driving wiring 10, supplies a pulse for driving the pixel 2 to the selected pixel driving wiring 10, and drives the pixels 2 in a row unit. That is to say, the vertical driving circuit 4 sequentially selects to scan the pixels 2 in the pixel array unit 3 in a row unit in a vertical direction and supplies a pixel signal based on a signal charge generated according to a light receiving amount by a photoelectric converting unit of each pixel 2 to the column signal processing circuit 5 through a vertical signal line 9.

The column signal processing circuit 5 arranged for each column of the pixels 2 performs signal processing such as noise removal on the signals output from the pixels 2 of one column for each pixel column. For example, the column signal processing circuit 5 performs the signal processing such as correlated double sampling (CDS) for removing a fixed pattern noise peculiar to the pixel and AD conversion.

The horizontal driving circuit 6 formed of a shift register, for example, sequentially selects each of the column signal processing circuits 5 by sequentially outputting horizontal scanning pulses and outputs the pixel signal from each of the column signal processing circuits 5 to a horizontal signal line 11.

The output circuit 7 performs signal processing on the signals sequentially supplied from each of the column signal processing circuits 5 through the horizontal signal line 11 to output. There is a case in which the output circuit 7 merely buffers, for example, or a case in which this performs block level adjustment, column variation correction, and various types of digital signal processing. An input/output terminal 13 communicates signals with the outside.

The solid-state imaging device 1 formed in the above-described manner is a CMOS image sensor referred to as a column AD type in which the column signal processing circuit 5 which performs CDS processing and AD conversion processing is arranged for each pixel column.

The solid-state imaging device 1 also is a rear surface irradiation MOS solid-state imaging device on which light is incident from a rear surface side on a side opposite to a surface of the semiconductor substrate 12 on which the pixel transistor is formed.

2. Pixel Structure According to this Embodiment

Figure 2:
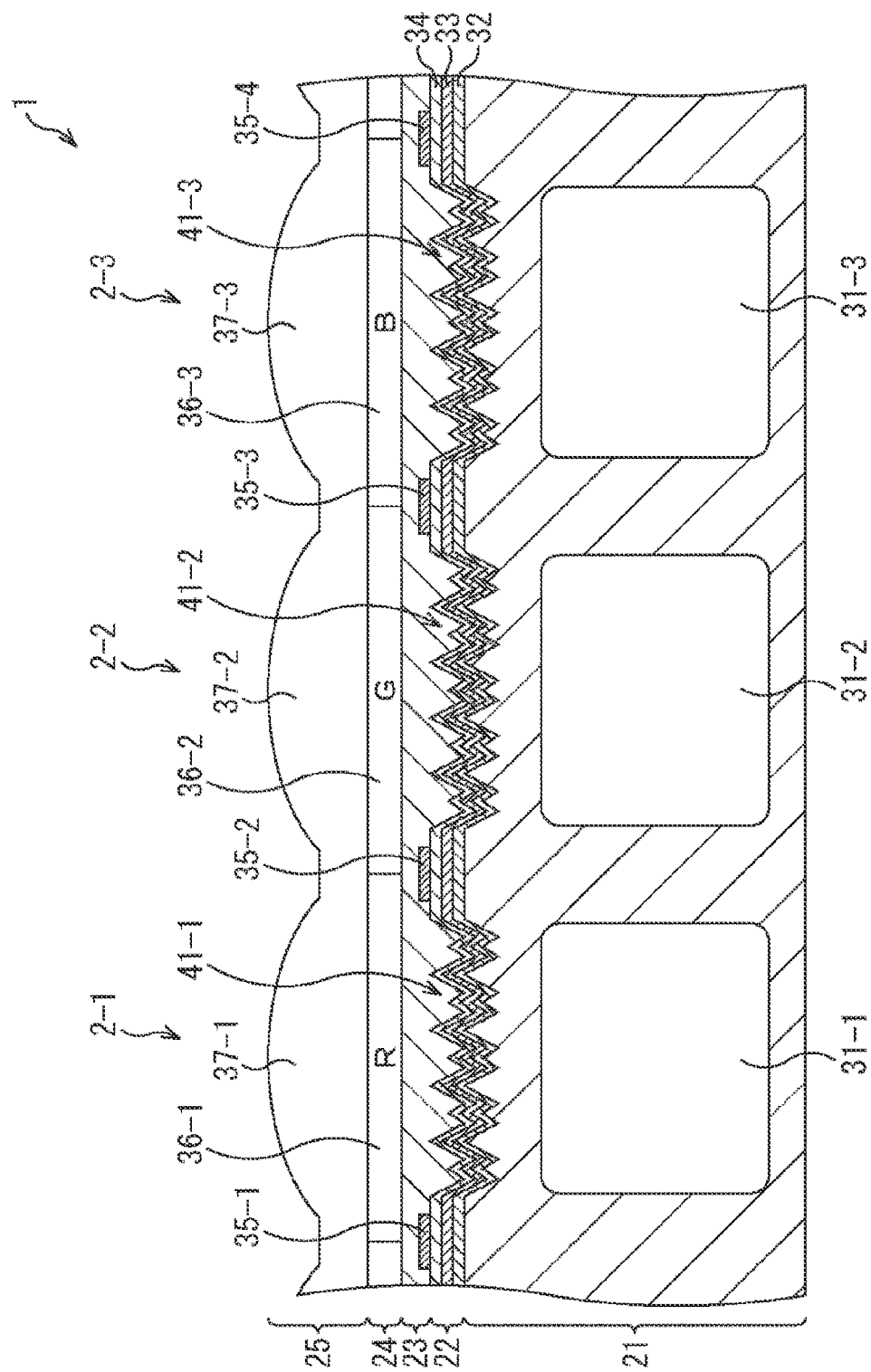
FIG. 2 is a view illustrating a cross-sectional configuration example of a pixel according to a first embodiment.

FIG. 2 is a view illustrating a cross-sectional configuration example of the pixel 2 according to this embodiment.

As illustrated in FIG. 2, the solid-state imaging device 1 is formed of the semiconductor substrate 21, an antireflection film 22, a flattening film 23, a color filter layer 24, and an on-chip lens layer 25 stacked on each other; FIG. 2 illustrates a cross-section of three pixels 2-1 to 2-3.

The semiconductor substrate 21 is a silicon wafer obtained by thinly slicing a single crystal of high purity silicon, for example, on which photoelectric converting units 31-1 to 31-3 each of which converts the incident light to an electric charge by the photoelectric conversion to accumulate are formed for the pixels 2-1 to 2-3, respectively.

The antireflection film 22 has a stacked structure obtained by stacking a fixed charge film and an oxidized film, for example; a high-k insulating thin film obtained by an atomic layer deposition (ALD) method may be used, for example. Specifically, hafnium oxide ($HfO_2$), aluminum oxide ($Al_2O_3$), titanium oxide ($TiO_2$), strontium titan oxide (STO) and the like may be used. In the example in FIG. 2, the antireflection film 22 is formed of a hafnium oxide film 32, an aluminum oxide film 33, and a silicon oxide film 34 stacked on each other.

In addition, a light-shielding film 35 is formed in a region serving as a boundary between the pixels 2 on the antireflection film 22. A material which shields light may be used as a material of the light-shielding film 35; a single layered metal film of titanium (Ti), titanium nitride (TiN), tungsten (W), aluminum (Al), tungsten nitride (WN) or the like is used, for example. Alternatively, a stacked film of such metal (for example, a stacked film of titanium and tungsten and a stacked film of titanium nitride and tungsten) may also be used as the light-shielding film 35.

The flattening film 23 formed by depositing an insulating material which transmits light, for example, flattens a surface. An organic material such as resin may be used, for example, as the material of the flattening film 23.

The color filter layer 24 is formed of filters 36 each of which transmits light of a predetermined color arranged for each pixel 2; the filters 36 which transmit the light of three primary colors (red, green, and blue) are arranged in a so-called Bayer array, for example. For example, as illustrated, a filter 36-1 which transmits red (R) light is arranged for the pixel 2-1, a filter 36-2 which transmits green (G) light is arranged for the pixel 2-2, and a filter 36-3 which transmits blue (B) light is arranged for the pixel 2-3. The color filter layer 24 is formed by spin coating of photosensitive resin containing pigments such as colorant and dye, for example.

The on-chip lens layer 25 is formed of on-chip lenses 37 each of which condenses light on the photoelectric converting unit 31 arranged for each pixel 2; as illustrated, on-chip lenses 37-1 to 37-3 are arranged for the pixels 2-1 to 2-3, respectively. The on-chip lens 37 is formed of a resin material such as styrene resin, acrylic resin, styrene-acrylic copolymer resin, or siloxane resin, for example.

The solid-state imaging device 1 is formed in this manner, and the light incident on the solid-state imaging device 1 from an upper side of FIG. 2 is condensed by the on-chip lenses 37 for the respective pixels 2 to be spectrally dispersed to respective colors by the filters 36. Then, the light transmitted through the flattening film 23 and the antireflection film 22 to be incident on the semiconductor substrate 21 is subjected to the photoelectric conversion by the photoelectric converting unit 31 for each pixel 2.

Hereinafter, a surface on a side from which the light is incident on the solid-state imaging device 1 (upper surface in FIG. 2) is appropriately referred to as a light incident surface. An antireflection structure 41 formed of a fine uneven structure (a so-called moth-eye structure) on the light incident surface of the semiconductor substrate 21 is provided on the light incident surface of the semiconductor substrate 21 for inhibiting reflection of the incident light incident on the semiconductor substrate 21. For example, in the configuration example illustrated in FIG. 2, antireflection structures 41-1 to 41-3 are provided for the pixels 2-1 to 2-3, respectively, and a flat surface is provided in an inter-pixel region between the pixels 2-1 to 2-3.

Next, the antireflection structure 41 is described with reference to FIG. 3.

Figure 3:
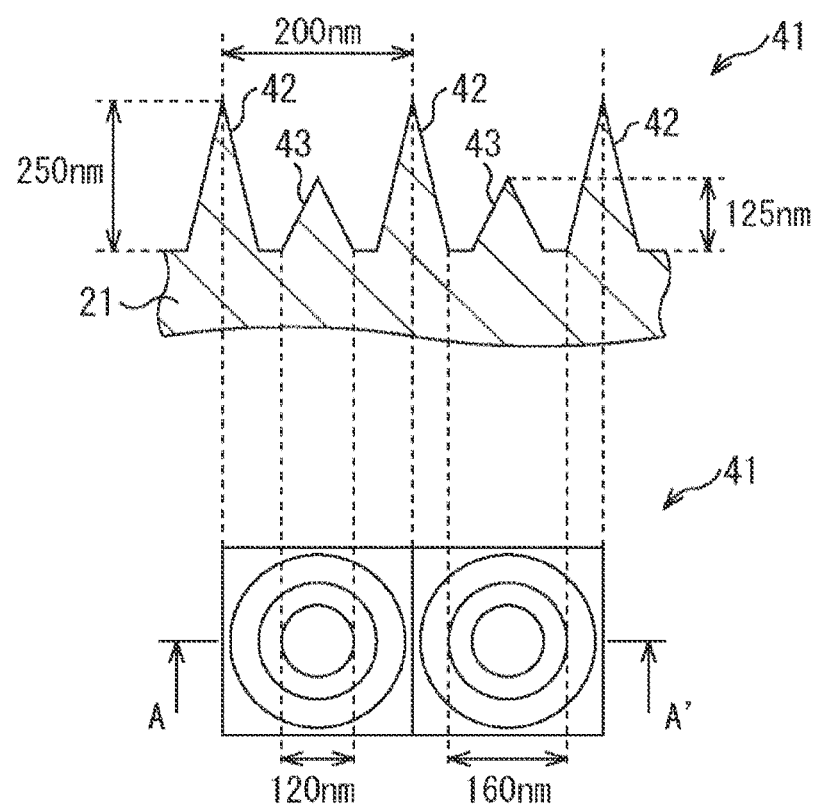
FIG. 3 is a view illustrating an antireflection structure.

FIG. 3 illustrates the antireflection structure 41 formed on the light incident surface of the semiconductor substrate 21 in an enlarged manner. A plan view of the antireflection structure 41 is illustrated on a lower side of FIG. 3 and a cross-sectional view taken along A-A' in the plan view is illustrated on an upper side of FIG. 3.

The antireflection structure 41 provided on the light incident surface of the semiconductor substrate 21 is configured such that a refractive index gradually changes by a structure in which a plurality of types of projections of different heights is formed. In an example in FIG. 3, it is configured such that the refractive index changes in two stages by providing two types of projections 42 and 43 of different heights. Specifically, the antireflection structure 41 is configured such that a plurality of projections 42 of 250 nm in height is formed at a 200 nm-pitch and the projection 43 of 125 nm in height is formed between the projections 42.

Figure 4:
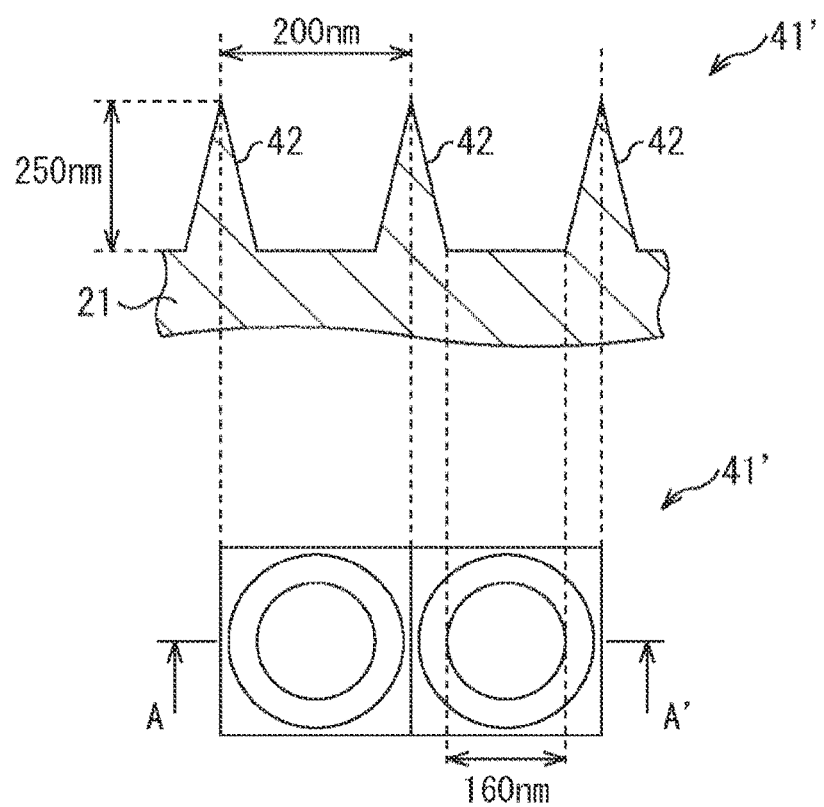
FIG. 4 is a view illustrating a conventional antireflection structure.

For example, as illustrated in FIG. 4, a conventional antireflection structure 41' is formed only of the projections 42 of the same height and a flat surface is formed between the projections 42. On the other hand, the antireflection structure 41 in FIG. 3 has the structure in which the projection 43 is formed in a flat site between the projections 42 at the time of processing with a processing condition of forming only the projections 42 as with the conventional antireflection structure 41'.

By configuring the antireflection structure 41 in this manner, the refractive index changes in two stages on the light incident surface, so that reflectivity on the light incident surface of the semiconductor substrate 21 may be decreased from that in the conventional antireflection structure 41'.

For example, the reflectivity on the light incident surface is described with reference to FIG. 5.

Figure 5:
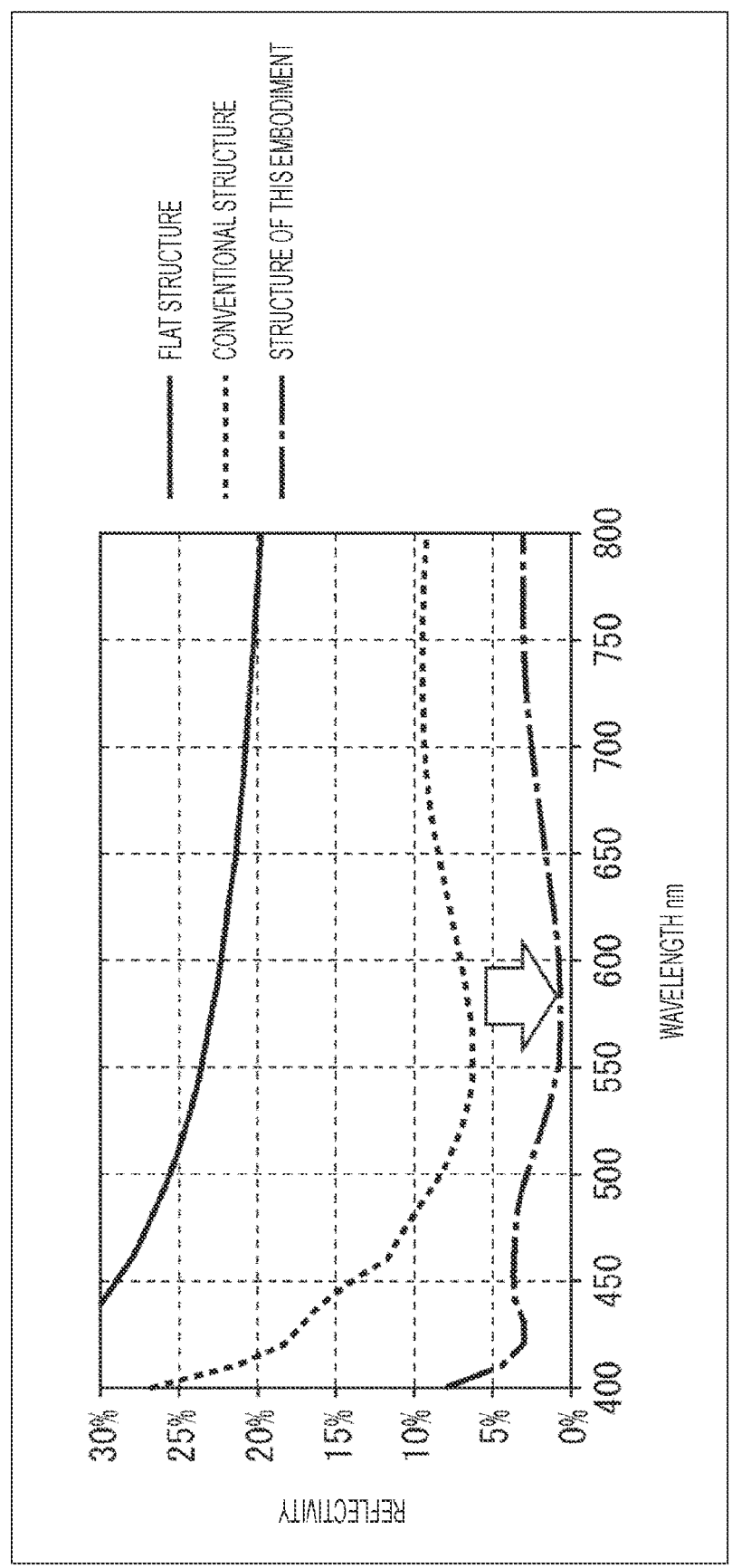
FIG. 5 is a view illustrating reflectivity on a light incident surface.

In FIG. 5, a wavelength of the light incident on the light incident surface and the reflectivity on the light incident surface are plotted along the abscissa and the ordinate, respectively.

A solid line in FIG. 5 indicates the reflectivity on the light incident surface having a flat structure without the moth-eye structure formed. Also, a broken line in FIG. 5 indicates the reflectivity on the light incident surface on which the conventional antireflection structure 41' formed only of the projections 42 of the same height is provided as illustrated in FIG. 4. Also, a dashed line in FIG. 5 indicates the reflectivity on the light incident surface on which the antireflection structure 41 of this embodiment as illustrated in FIG. 3, that is to say, the antireflection structure 41 formed of the two types of projections 42 and 43 of the different heights is provided.

As illustrated in FIG. 5, with the antireflection structure 41, it is possible to significantly decrease the reflectivity at all the wavelengths from that with the conventional antireflection structure 41'. Meanwhile, although it is illustrated that the reflectivity is decreased also with the conventional antireflection structure 41' as compared to that on the light incident surface having the flat structure, the reflectivity is not less than 5% across all the wavelengths of the incident light. In contrast, it is illustrated that the reflectivity may be inhibited to 1% or less in the vicinity of an area from 550 nm to 600 nm of the wavelength of the incident light, for example, with the antireflection structure 41.

Therefore, it is possible to inhibit the reflection of the incident light incident on the semiconductor substrate 21 by the antireflection structure 41 capable of decreasing the reflectivity in this manner, so that it is possible to improve sensitivity of the pixel 2 to improve quality of the image taken by the solid-state imaging device 1.

The solid-state imaging device 1 is configured in this manner, and the antireflection structure 41 formed of a plurality of types of projections of the different heights may be manufactured by performing processing of digging the light incident surface of the semiconductor substrate 21 in a plurality of stages with different processing conditions.

Next, a method of manufacturing the solid-state imaging device 1 is described with reference to FIGS. 6 and 7.

Figure 6:
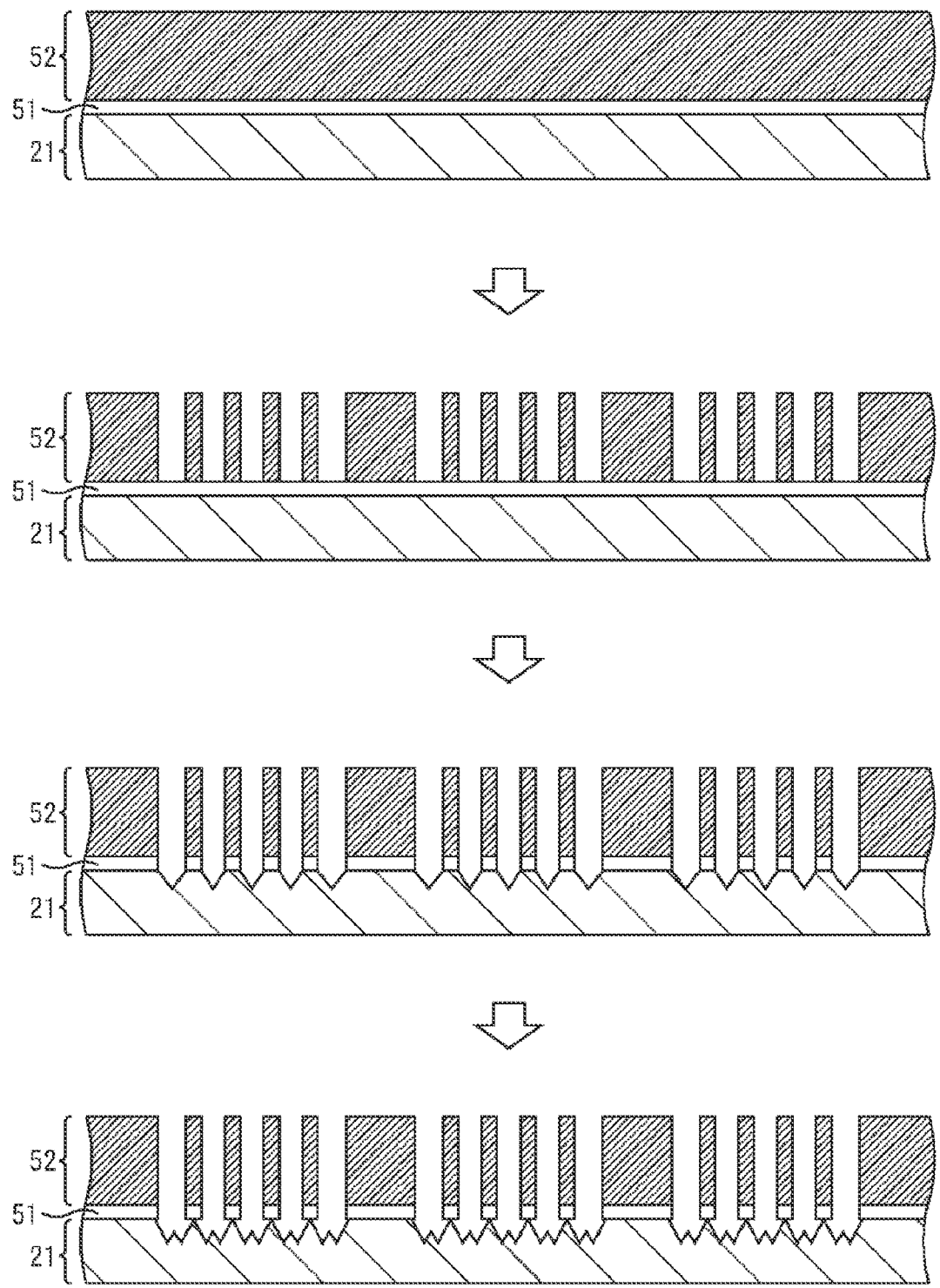
FIG. 6 is a view illustrating a method of manufacturing the solid-state imaging device.

First, as illustrated in an uppermost stage of FIG. 6, at a first step, a hard mask layer 51 formed of silicon oxide ($SiO_2$) and the like is deposited on a rear surface of the semiconductor substrate 21 thinned from the rear surface side after the photoelectric converting unit 31 is formed and resist 52 is applied thereon.

At a second step, a pattern corresponding to a region in which the projection 42 is formed is exposed and the resist 52 in a portion other than the region is removed as illustrated in a second stage from above of FIG. 6. According to this, the resist 52 has a shape in which the pattern corresponding to the region in which the projection 42 is formed is left.

At a third step, dry etching is performed with a predetermined ion amount set in a first processing condition, then the hard mask layer 51 is removed according to the pattern of the resist 52 and the rear surface of the semiconductor substrate 21 is processed. According to this, the rear surface of the semiconductor substrate 21 is dug and a concave portion having a V cross-sectional shape is formed according to a crystal structure of the semiconductor substrate 21 as illustrated in a third stage from above of FIG. 6.

At a fourth step, the dry etching is performed with a second processing condition different from the first processing condition, for example, the second processing condition set to increase the ion amount than that in the first processing condition. In this manner, the fine uneven structure formed of the two types of projections 42 and 43 of the different heights is formed as illustrated in a fourth stage from above of FIG. 6 by performing etching in two steps with the different processing conditions.

Figure 7:
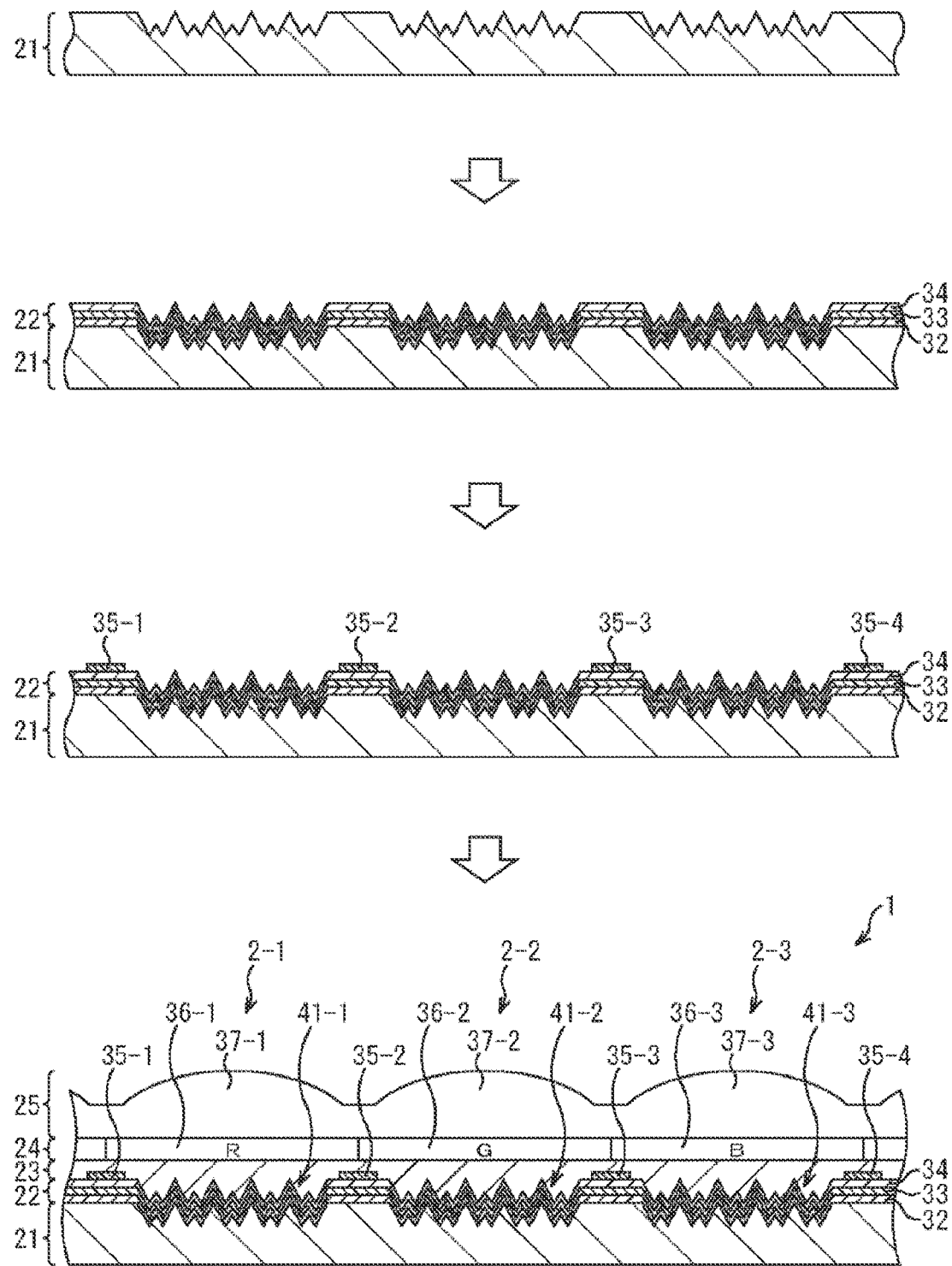
FIG. 7 is a view illustrating the method of manufacturing the solid-state imaging device.

Next, as illustrated in an uppermost stage in FIG. 7, at a fifth step, the hard mask layer 51 and the resist 52 are removed.

At a sixth step, as illustrated in a second stage from above of FIG. 7, the hafnium oxide film 32, the aluminum oxide film 33, and the silicon oxide film 34 are stacked on an entire surface including the fine uneven structure formed on the rear surface of the semiconductor substrate 21, so that the antireflection film 22 is deposited.

At a seventh step, as illustrated in a third stage from above of FIG. 7, the light-shielding film 35 is formed in the region serving as the boundary between the pixels 2 on the antireflection film 22.

Then, at an eighth step, as illustrated in a fourth stage from above of FIG. 7, the flattening film 23 is deposited and the color filter layer 24 and the on-chip lens layer 25 are stacked, and the solid-state imaging device 1 is manufactured.

As described above, in the solid-state imaging device 1, it is possible to provide the antireflection structure 41 in which the two types of projections 42 and 43 of the different heights are formed by etching in two steps with different processing conditions.

At that time, in the solid-state imaging device 1, it is possible to prevent occurrence of a trouble (for example, deterioration in a dark characteristic and a residue) worried when long processing time is set, for example, described above. That is to say, the solid-state imaging device 1 may have a more excellent characteristic as compared to a configuration in which the concave portion of the fine uneven structure is formed deeply. That is to say, the solid-state imaging device 1 may decrease the reflectivity without forming the deep concave portion of the fine uneven structure.

According to this, the solid-state imaging device 1 may prevent occurrence of flare or ghost described above, for example, and may take a higher quality image.

Although the antireflection structure 41 is formed of the two types of projections 42 and 43 of the different heights in the above-described embodiment, this may also be formed of two or more types of projections of different heights. For example, it is possible to form the antireflection structure 41 of three or more types of projections of different heights.

Figure 8:
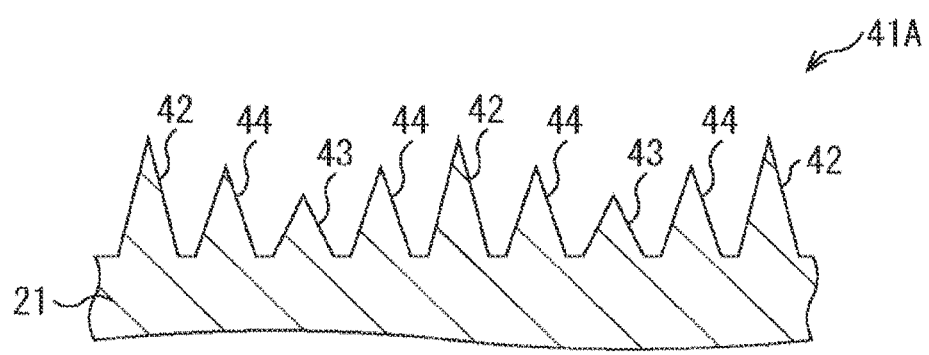
FIG. 8 is a view illustrating a variation of the antireflection structure.

FIG. 8 illustrates a variation of the antireflection structure.

An antireflection structure 41A illustrated in FIG. 8 is configured such that three types of projections 42, 43, and 44 of different heights are formed on the light incident surface of the semiconductor substrate 21. That is to say, the antireflection structure 41A is configured such that the projection 44 of medium height is formed between the high projection 42 and the low projection 43.

By providing the three types of projections 42, 43, and 44 of the different heights in this manner, the antireflection structure 41A is configured such that the refractive index changes in three stages and the reflectivity may be further decreased.

Meanwhile, although the configuration in which the antireflection structure 41 is provided on the light incident surface of the semiconductor substrate 21 is described in this embodiment, the antireflection structure 41 may also be provided in a place other than the light incident surface as long as this is provided on a side from which the light is incident on the semiconductor substrate 21. For example, it is possible to provide the antireflection structure in which a plurality of projections of the different heights is formed on a surface of the flattening film 23 on a light incident surface side of the semiconductor substrate 21, a surface of the color filter layer 24, and a surface of the on-chip lens layer 25.

3. Example of Application to Electronic Device

Application of the technology of the present disclosure is not limited to that to the solid-state imaging device. That is to say, the technology of the present disclosure may be generally applied to electronic devices in which the solid-state imaging device is used in an image capturing unit (photoelectric converting unit) such as an imaging device such as a digital still camera and a video camera, a portable terminal device having an imaging function, and a copying machine in which the solid-state imaging device is used in the image reading unit. The solid-state imaging device may have a form formed as one chip or may have a modular form having the imaging function in which an imaging unit and a signal processor or an optical system are collectively packaged.

Figure 9:
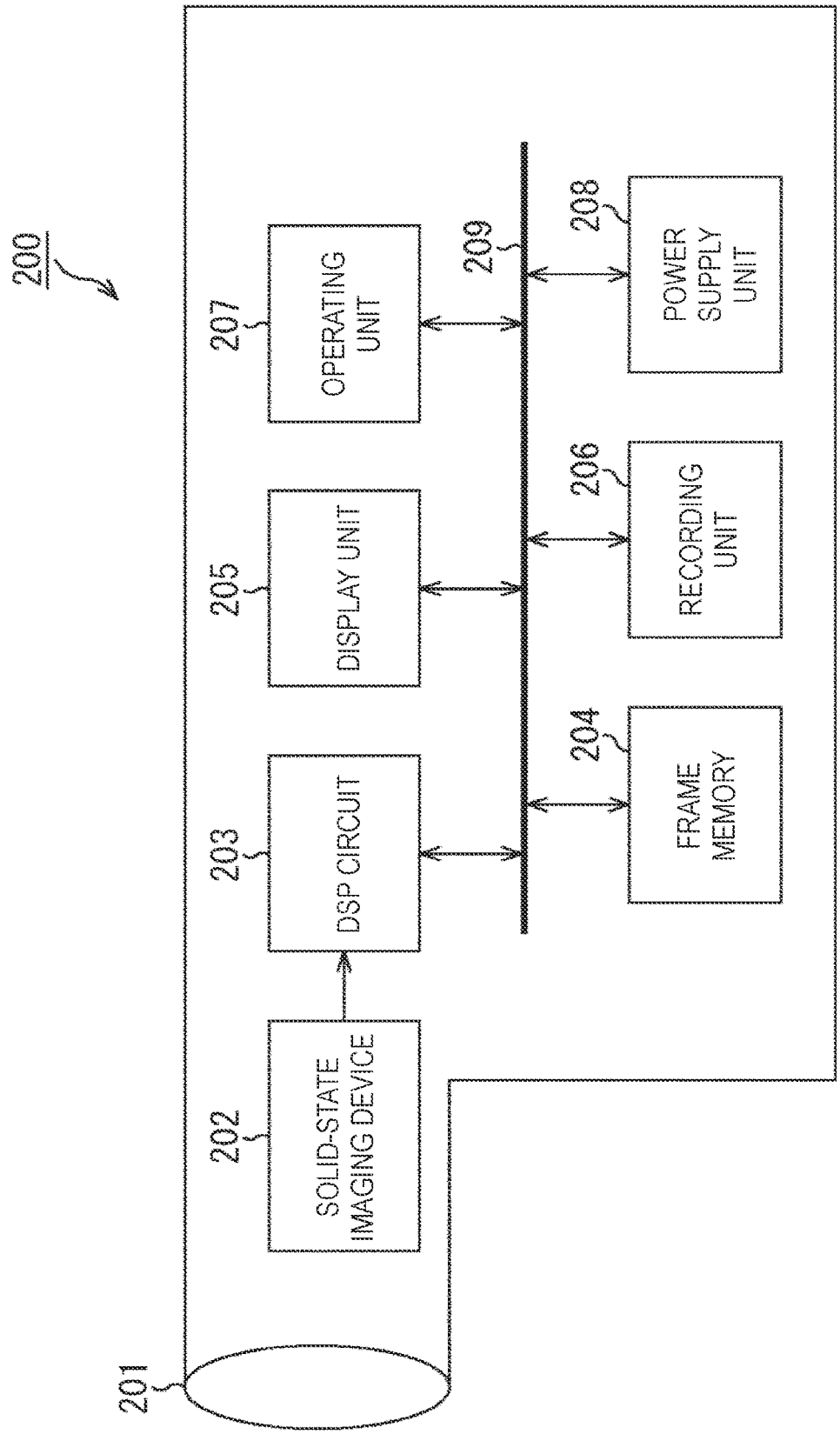
FIG. 9 is a block diagram illustrating a configuration example of the imaging device as an electronic device according to the present disclosure.

FIG. 9 is a block diagram illustrating a configuration example of the imaging device as the electronic device according to the present disclosure.

An imaging device 200 in FIG. 9 is provided with an optical unit 201 formed of a lens group and the like, a solid-state imaging device (imaging device) 202 to which the configuration of the solid-state imaging device 1 in FIG.

1 is adopted, and a digital signal processor (DSP) circuit 203 being a camera signal processing circuit. The imaging device 200 is also provided with a frame memory 204, a display unit 205, a recording unit 206, an operating unit 207, and a power supply unit 208. The DSP circuit 203, the frame memory 204, the display unit 205, the recording unit 206, the operating unit 207, and the power supply unit 208 are connected to one another through a bus line 209.

The optical unit 201 captures incident light (image light) from an object to form an image on an imaging surface of the solid-state imaging device 202. The solid-state imaging device 202 converts a light amount of the incident light the image of which is formed on the imaging surface thereof by the optical unit 201 to an electric signal in a pixel unit to output as a pixel signal. As the solid-state imaging device 202, the solid-state imaging device 1 in FIG. 1, that is to say, the solid-state imaging device in which the reflectivity on the light incident surface is inhibited may be used.

The display unit 205 formed of a panel display device such as a liquid crystal panel and an organic electro luminescence (EL) panel, for example, displays a moving image or a still image taken by the solid-state imaging device 202. The recording unit 206 records the moving image or the still image taken by the solid-state imaging device 202 in a recording medium such as a hard disk and a semiconductor memory.

The operating unit 207 issues an operation command regarding various functions of the imaging device 200 under operation by a user. The power supply unit 208 appropriately supplies various power sources serving as operation power sources of the DSP circuit 203, the frame memory 204, the display unit 205, the recording unit 206, and the operating unit 207 to supply targets.

As described above, it is possible to prevent the reflection of the incident light by using the above-described solid-state imaging device 1 as the solid-state imaging device 202. Therefore, it is possible to improve the quality of the taken image also in the imaging device 200 such as the video camera and the digital still camera, and further a camera module for a mobile device such as a cellular phone.

Meanwhile, the present technology may also have the following configurations.

(1) A solid-state imaging device including:
a semiconductor substrate on which a photoelectric converting unit is formed for each of a plurality of pixels; and
an antireflection structure being the structure provided on a light incident surface side from which light is incident on the semiconductor substrate in which a plurality of types of projections of different heights is formed.

(2) The solid-state imaging device according to (1) described above,
wherein the antireflection structure is formed by performing processing of digging a light incident surface of the semiconductor substrate in a plurality of stages with different processing conditions.

(3) The solid-state imaging device according to (1) or (2) described above,
wherein the antireflection structure is the structure in which a second projection lower than a first projection is formed between first projections of predetermined height.

(4) The solid-state imaging device according to (3) described above,
wherein the antireflection structure is formed by
forming a mask of a pattern corresponding to a site in which the first projection is provided on the light incident surface of the semiconductor substrate,
performing processing of digging the light incident surface of the semiconductor substrate with a first processing condition, and
performing processing of further digging the light incident surface with a second processing condition different from the first processing condition to leave the second projection.

(5) A method of manufacturing including a step of:
forming an antireflection structure being the structure provided on a light incident surface side from which light is incident on a semiconductor substrate on which a photoelectric converting unit is formed for each of a plurality of pixels in which a plurality of types of projections of different heights is formed by performing processing of digging a light incident surface of the semiconductor substrate in a plurality of stages with different processing conditions.

(6) An electronic device including:
a solid-state imaging device including
a semiconductor substrate on which a photoelectric converting unit is formed for each of a plurality of pixels; and
an antireflection structure being the structure provided on a light incident surface side from which light is incident on the semiconductor substrate in which a plurality of types of projections of different heights is formed.

Meanwhile, this embodiment is not limited to the above-described embodiment and may be variously change without departing from the scope of the present disclosure.

REFERENCE SIGNS LIST

1 Solid-state imaging device
2 Pixel
3 Pixel array unit
12 Semiconductor substrate
21 Semiconductor substrate
22 Antireflection film
23 Flattening film
24 Color filter film
25 On-chip lens layer
31 Photoelectric converting unit
32 Hafnium oxide film
33 Aluminum oxide film
34 Silicon oxide film
35 Light-shielding film
36 Filter
37 On-chip lens
41 Antireflection structure
42 to 44 Projection
51 Hard mask layer
52 Resist
200 Imaging device
202 Solid-state imaging device

The invention claimed is:
1. A light detecting device, comprising:
a plurality of pixels arranged in columns and rows, wherein each pixel includes:
a photoelectric conversion region disposed in a semiconductor substrate; and
a moth-eye structure on a surface of a light incident side of the semiconductor substrate and over the photoelectric conversion region, wherein the moth-eye structure includes:
a first convex portion disposed over the photoelectric conversion region;
a second convex portion disposed over the photoelectric conversion region; and a third convex portion disposed over the photoelectric conversion region, wherein the first convex portion, the second convex portion, and the third convex portion have different heights respectively in a cross-sectional view; and a light shielding film disposed between adjacent pixels in the cross-sectional view.

2. The light detecting device of claim 1, wherein:
the first convex portion is adjacent to the second convex portion, and
a height of the first convex portion is larger than a height of the second convex portion in the cross-sectional view.

3. The light detecting device of claim 1, wherein:
the second convex portion is adjacent to the third convex portion, and
a height of the second convex portion is larger than a height of the third convex portion in the cross-sectional view.

4. The light detecting device of claim 1, wherein the second convex portion is disposed between the first convex portion and the third convex portion in the cross-sectional view.

5. The light detecting device of claim 1, further comprising an oxide film including aluminum, the oxide film being disposed on the moth-eye structure.

6. The light detecting device of claim 1, further comprising a flat portion disposed between the first convex portion and the second convex portion in the cross-sectional view.

7. The light detecting device of claim 1, wherein the light shielding film includes tungsten.

8. An electronic device, comprising:
a plurality of pixels arranged in columns and rows, wherein each pixel includes:
a photoelectric conversion region disposed in a semiconductor substrate; and
a moth-eye structure on a surface of a light incident side of the semiconductor substrate and over the photoelectric conversion region, wherein the moth-eye structure includes:
a first convex portion disposed over the photoelectric conversion region;
a second convex portion disposed over the photoelectric conversion region; and
a third convex portion disposed over the photoelectric conversion region, wherein the first convex portion, the second convex portion, and the third convex portion have different heights respectively in a cross-sectional view; and
a light shielding film disposed between adjacent pixels in the cross-sectional view.

9. The electronic device of claim 8, wherein:
the first convex portion is adjacent to the second convex portion, and
a height of the first convex portion is larger than a height of the second convex portion in the cross-sectional view.

10. The electronic device of claim 8, wherein:
the second convex portion is adjacent to the third convex portion, and
a height of the second convex portion is larger than a height of the third convex portion in the cross-sectional view.

11. The electronic device of claim 8, wherein the second convex portion is disposed between the first convex portion and the third convex portion in the cross-sectional view.

12. A method, comprising:
forming a plurality of pixels arranged in columns and rows, wherein each pixel includes:
a photoelectric conversion region disposed in a semiconductor substrate; and
a moth-eye structure on a surface of a light incident side of the semiconductor substrate and over the photoelectric conversion region, wherein the moth-eye structure includes:
a first convex portion disposed over the photoelectric conversion region;
a second convex portion disposed over the photoelectric conversion region; and
a third convex portion disposed over the photoelectric conversion region, wherein the first convex portion, the second convex portion, and the third convex portion have different heights respectively in a cross-sectional view; and
disposing a light shielding film between adjacent pixels in the cross-sectional view.

13. The method of claim 12, wherein:
the first convex portion is adjacent to the second convex portion, and
a height of the first convex portion is larger than a height of the second convex portion in the cross-sectional view.

14. The method of claim 12, wherein:
the second convex portion is adjacent to the third convex portion, and
a height of the second convex portion is larger than a height of the third convex portion in the cross-sectional view.

15. The method of claim 12, wherein the second convex portion is disposed between the first convex portion and the third convex portion in the cross-sectional view.

* * * * *